United States Patent [19]
Larkin et al.

[11] Patent Number: 5,463,978
[45] Date of Patent: Nov. 7, 1995

[54] COMPOUND SEMICONDUCTOR AND CONTROLLED DOPING THEREOF

[75] Inventors: David J. Larkin, North Olmsted; Philip G. Neudeck, Strongsville; J. Anthony Powell, North Olmsted; Lawrence G. Matus, Amherst, all of Ohio

[73] Assignee: Ohio Aerospace Institute, Brook Park, Ohio

[21] Appl. No.: 276,599

[22] Filed: Jul. 18, 1994

Related U.S. Application Data

[63] Continuation of Ser. No. 8,650, Jan. 25, 1993.
[51] Int. Cl.$^6$ .................................................. H01L 21/20
[52] U.S. Cl. ............................. 117/89; 117/103; 117/951; 117/93; 437/100
[58] Field of Search ................................. 117/89, 93, 102, 117/951; 437/100

[56] References Cited

U.S. PATENT DOCUMENTS

| 2,854,364 | 9/1958 | Lely | 148/1.5 |
|---|---|---|---|
| 3,520,740 | 7/1970 | Addamiano | 148/175 |
| 3,956,032 | 5/1976 | Powell et al. | 148/175 |
| 3,960,619 | 6/1976 | Seiter | 148/175 |
| 4,147,572 | 4/1979 | Vodakov et al. | 148/175 |
| 4,385,199 | 5/1983 | Hamakawa et al. | 136/258 |
| 4,585,671 | 4/1986 | Kitagawa et al. | 427/54.1 |
| 4,755,483 | 7/1988 | Haku et al. | 437/100 |
| 4,866,005 | 9/1989 | Davis et al. | 437/100 |
| 4,912,063 | 3/1990 | Davis et al. | 437/100 |
| 4,912,064 | 3/1990 | Kong et al. | 437/100 |
| 4,946,547 | 8/1990 | Palmour et al. | 156/643 |
| 5,011,549 | 4/1991 | Kong et al. | 148/33.1 |
| 5,030,580 | 7/1991 | Furukawa et al. | 437/22 |
| 5,037,502 | 8/1991 | Suzuki et al. | 156/610 |
| 5,119,540 | 6/1992 | Kong et al. | 29/25.01 |
| 5,162,243 | 11/1992 | Streit et al. | 437/31 |

OTHER PUBLICATIONS

H. J. Kim et al., "Theoretical and Empirical Studies of Impurity Incorporation into β–SiC Thin Films during Epitaxial Growth" J. Electrochem. Soc. vol. 133, No. 11, pp. 2350–2357 (Nov. 1986).

H. Matsunami, et al. "VPE Growth of SiC on Step Controlled Substrates" Springer Proc. in Physics, vol. 34 pp. 34–39 (1989).

J. A. Powell, et al, "Growth of improved 3C–SiC Films on 6H–SiC substrates" Appl. Phys. Lett 56 (14) 2 Apr. 1990 pp. 1353–1355.

J. A. Lely; Preparation of Single Crystals of Silicon Carbide and Control of the Nature and The Quantity of the Combined Inpurities; Berichte der Deutschen Keramischen Gesellschaft, vol. 32; 229–250; (1955).

Robert F. Davis et al; Thin Film Deposition and Microelectronic and Optoelectronic Device Fabrication and Characterization in Monocrystalline Alpha and Beta Silicon Carbide; Proceedings of the EEE, vol. 79, No. 5, 677–701 (1991).

J. A. Powell et al; Growth of high quality 6H–SiC epitaxial films on vicinal (001) 6H–SiC wafers; Appl. Phys. Lett. 56(15); 1442–1444 (1990).

H. S. Kong et al; Epitaxial growith of β–SiC thin films on 6H α–SiC substrates via chemical vapor deposition, Appl. Phys. Lett. 49(17); 1074–1076 (1986).

(List continued on next page.)

Primary Examiner—R. Bruce Breneman
Assistant Examiner—Linda J. Fleck
Attorney, Agent, or Firm—Vickers, Daniels & Young

[57] ABSTRACT

A method of controlling the amount of impurity incorporation in a crystal grown by a chemical vapor deposition process. Conducted in a growth chamber, the method includes the controlling of the concentration of the crystal growing components in the growth chamber to affect the demand of particular growth sites within the growing crystal thereby controlling impurity incorporation into the growth sites.

59 Claims, 6 Drawing Sheets

OTHER PUBLICATIONS

H. S. Kong et al; Growth rate, surface morphology, and defect microstructures of β–SiC films chemically vapor deposited on 6H–SiC substrates; J. Mater.Res., vol. 4, No. 1; 204–214 (1989).

J. A. Powell et al; Growth of improved quality 3C–SiC films on 6H–SiC substrates; Appl. Phys. Lett. 56(14); 1353–1355 (1990).

Yu M. Tairov et al; General Principles of Growing Large–Size Single Crystals of Various Silicon Carbide Polytypes; Journal of Crystal Growth, vol. 52; 146–150; (1981).

Guther Ziegler et al; Single Crystal Growth of SiC Substrate Material for Blue Light Emitting Diodes; TEEE Transactions On Electron Devices, vol. ED–30, No. 4; 277–281; (1983).

Y. M. Tairov et al; Progress Controlling the Growith of Polytypic Crystals; Progressive Crystal Growith & Characterization, vol. 7; 111–161 (1983).

S. Karmann et al; CVD Growth and Characterization of undoped and Nitrogen–doped single crystalline 6H Silicon Carbide Epilayers; J. Appl. Phys. (1992).

James A. Mackin; Process For The Homoepitaxial Growith of Single–Crystal Silicon Carbide Films On Silicon Carbide Wafers; NASA Case No. LEW–15, 223–1.

James A. Mackin; Process For The Controlled Growth of Single–Crystal Films Of Silicon Carbide Polytypes On Silicon Carbide Wafers; NASA Case No. LEW–15,222–1.

COMPOUND SEMICONDUCTOR AND CONTROLLED DOPING THEREOF

This is a continuation of U.S. application Ser. No. 008,650 filed Jan. 25, 1993.

The invention relates to the controlled growth of high-quality semiconductor device crystal films, and more particularly, to a method and system for producing high-quality silicon carbide semiconductors which are highly reproducible.

This invention is made with government support under a government contract awarded by NASA. The government has certain rights in the invention.

INCORPORATION BY REFERENCE

United States Patent Application entitled "Process For The Controlled Growth Of Single-Crystal Films Of Silicon Carbide Polytypes On Silicon Carbide Wafer" identified by attorney docket number LEW-15,222-1 and United States Patent Application entitled "Process For The Homoepitaxial Growth Of Single-Crystal Silicon Carbide Films On Silicon Carbide Wafers" identified by attorney docket number LEW-15,223-1 which both illustrate the pretreatment of a silicon carbide substrate are incorporated herein by reference.

BACKGROUND OF THE INVENTION

The invention is particularly applicable to production of silicon carbide crystals (herein used to include crystal films) and it will be discussed with particular reference thereto; however, the invention has much broader applications and can be used for other crystals grown by the chemical vapor deposition process.

Semiconductor devices are used in a wide variety of electronic applications. Semiconductor devices include diodes, transistors, integrated circuits, light-emitting diodes and charge-coupled devices. Various semiconductor devices using silicon or compound semiconductors such as gallium arsenic (GaAs) and gallium phosphide (GAP) are commonly used. In order to fabricate semiconductor devices, it is necessary to be able to grow high-quality, low-defect-density single-crystal films with controlled impurity incorporation (with respect to both net concentration and concentration profile) while possessing good surface morphology. In recent years, there has been an increasing interest in research of the silicon carbide semiconductors for use in high temperature, high powered and/or high radiation operating conditions under which silicon and conventional III–V semiconductors cannot adequately function.

Silicon carbide has been classified as a compound semiconductor with potentially superior semiconductor properties for use in applications involving high temperature, high power, high radiation and/or high frequency. Silicon carbide has a number of characteristics that make it highly advantageous for various uses. Such advantages include a wide energy gap of approximately 2.2 to 3.3 electron volts, a high thermal conductivity, a low dielectric constant, a high saturated electron drift velocity, a high breakdown electric field, a low minority carrier lifetime, and a high disassociation temperature. Furthermore, silicon carbide is thermally, chemically and mechanically stable and has a great resistance to radiation damage. In addition, a variety of optical devices, such as light-emitting diodes (LEDs) can be fabricated from silicon carbide and operated at temperatures exceeding 600° C. Despite these many advantages and capabilities of silicon carbide semiconductor devices, large scale commercialization of silicon carbide devices has been slow because of the lack of control over the crystal quality, growth reproducibility, and controlled dopant incorporation into the silicon carbide crystals.

Several properties of SiC contribute to this lack of control. First, it does not melt at reasonable pressures and it sublimes at temperatures above 1800° C. Second, it grows in many different crystal structures, called polytypes. Third, post-growth doping attempts (i.e. diffusion into the crystal from a gas phase species as is used in the silicon industry) are not effective in SiC crystals. Other known post-growth doping techniques (i.e. ion implantation) typically result in considerable crystal damage. Attempts to remove this crystal damage, and therefore improve device performance by post-annealing, commonly result in severe dopant profile redistribution.

Since molten-SiC growth techniques cannot be applied to SiC, two techniques have been developed to grow silicon carbide crystals. The first technique is known as chemical vapor deposition (CVD) in which reacting gases are introduced into a crystal chamber to form silicon carbide crystals upon an appropriate heated substrate. A second technique for growing bulk silicon carbide crystals is generally referred to as the sublimation technique or Lely process. In the sublimation technique, some type of solid silicon carbide material other than the desired single crystal in a particular polytype is used as a starting material and heated until the solid silicon carbide sublimes. The vaporized material is then condensed to produce the desired crystals. Although a large number of crystals can be obtained by either the sublimation method or the epitaxial growth method (CVD), it is difficult to prepare large single crystals of silicon carbide and to control with high accuracy the size, shape, polytype and doping of the silicon carbide crystals.

Silicon carbide crystals exist in hexagonal, rhombohedral and cubic crystal structures. Generally, the cubic structure, with the zincblende structure, is referred to as the β-SiC or 3C-SiC whereas numerous polytypes of the hexagonal and rhombohedral forms are collectively referred to as α-SiC. The most common α-SiC polytype is 6H-SiC. Each of the various silicon carbide polytypes have unique electrical and optical properties which give them advantages over the other polytypes in particular applications. For example, the 6H-SiC polytype has a bandgap of about 2.9 electron volts and a hexagonal structure, wherein the 3C-SiC polytype has a lower bandgap of about 2.2 electron volts and has a higher symmetry structure than the 6H-SiC polytype. These property differences lead to advantages for the 6H-SiC polytype in some applications such as a wider bandgap resulting in blue light-emitting diodes and operation at higher temperatures. On the other hand, the 3C-SiC polytype has a higher electron mobility leading to a higher frequency of operation.

SiC polytypes are formed by the stacking of double layers of Si and C atoms. Each double layer may be situated in one of three positions. The sequence of stacking which determines the particular polytype. The stacking direction is called the crystal c-axis which is perpendicular to the basal plane. For 6H-SiC polytypes, the (0001) plane (the Si-face) or (000T) plane (the C-face) is known as the basal plane and for 3C-SiC, the plane (111) is equivalent to the (0001) basal plane.

Many advances have been made in the growing of higher quality 6H-SiC and 3C-SiC crystals having fewer dislocations, stacking faults, microtwins, double positioning boundaries (DPBs), threading dislocations and anti-phase boundaries (APBs). However, with all the advances in growing 3C-SiC and 6H-SiC crystals, the controlled purity and doping of such crystals is limited. Furthermore, controlled and reproducible degenerate doping or very low doping has of yet been unachievable. Dopant incorporation in a grown crystal is known as intentional impurity incorporation and, contaminant incorporation into the crystal is known as unintentional impurity incorporation (i.e. contamination). During the sublimation or CVD crystal growing process, various compounds and/or elements are intentionally and unintentionally incorporated into the crystal. Various techniques of limited success have been used to exclude contaminants from a crystal to produce highly pure crystals. One technique reported for InP and GaAs CVD growth systems is the use of a blocking technique whereby relatively large amounts of a crystal compound are used to block or shield the crystal surface from impurities. *Chemistry of The In-$H_2PCl_3$ Process* by R. C. Clarke, *Inst. Phys. Conf.*; Ser. No. 45; Chapter 1 (1979) 19–27 and *Doping Behavior of Silicon and Vapor Growth III–V Epitaxial Films* by H. P. Pogue and B. M. Quimlich, *J. Crystal Growth* 31 (1975) 183–89. Although the blocking technique reduces contaminant incorporation into a crystal, the required use of large amounts of a crystal growing compound to effect blocking has adverse effects on crystal quality and surface morphology. In addition to the problems associated with contaminant exclusion, the controlled intentional doping of crystals at relatively low concentrations has of yet been unachievable and unreproducible. Furthermore, techniques to control and/or reproduce sharp dopant concentration profiles within crystals (i.e. from p-type to n-type, degenerate to lightly doped) are also unavailable.

A variety of prior art techniques have been developed, and tried, in an attempt to control the impurity incorporation in the growing SiC films. For example, molecular beam epitaxy (MBE) utilizes an ultrahigh vacuum system and the growth of the crystal occurs by using a stream of molecules which is formed into a beam and focused onto a heated substrate. This technique does offer some amount of control over dopant-concentration profiles. However, the low rate of growth is a major drawback and poses several problems. First, commercialization is not practical because of the very low growth rate. Second, the impurity incorporation is still limited by the purity of the source gas and cleanliness of the growth reactor. Furthermore, the problem of impurity incorporation is exacerbated by the very slow growth rate.

Another technique for doping SiC is the use of ion implantation, which is a post-growth doping technique used to introduce the desired dopants. This method produces a large amount of damage to the crystal structure and typically requires a post-anneal step to reduce the high density of defects (which greatly affects device quality) generated by this technique. Furthermore, as a result of the unusually high temperatures (>1800° C.) needed for the only partially effective annealing of SiC crystals, the dopant concentration changes by a factor of four (4×) for p-type and is lost via out-diffusion for the n-type dopants.

When degenerately doped layers are desired, such as the case when metal contact layers are needed, obtaining degenerate p-type via CVD is limited by problems such as gas phase nucleation (from an excessively high concentration of p-type source gas needed) which results in very poor film morphologies.

As a result of the inadequate techniques available to control dopant and/or contaminant incorporation into crystals grown in a CVD process, there is a demand for a method to selectively exclude impurities from a CVD grown crystal.

THE INVENTION

The present invention relates to a method of growing high-quality crystals and controlling the impurity or dopant incorporation during crystal growth.

In accordance with the principal feature of the invention, there is provided a system and a method of controlling the amount of a selected element deposited in a given growth area of a crystal grown by the chemical vapor deposition (CVD) process. The type of crystal grown is a SiC crystal wherein silicon (Si) is deposited in Si growth sites and carbon (C) is deposited in C growth sites at the growth area. The selected element competes for either the Si growth site or C growth site during SiC crystal growth. The improvement comprises flowing of a first amount of a gaseous Si compound through the growth chamber and flowing a second amount of a gaseous C compound through the growth chamber and controlling the ratio of the first amount of Si compound relative to the second amount of C compound to control the amount of the selected element deposited in the SiC crystal at the crystal growth area. The selected element is an impurity and is either a dopant or a contaminant.

A crystal growth chamber is used to grow the crystals by chemical vapor deposition. The crystal growing chamber includes a crystal growing area upon which crystals are grown. The crystal growing chamber may also include a heating element to control the temperature within the crystal growing chamber. The crystals are formed within the crystal growing chamber by introducing vaporized crystal growing compounds into the chamber. A carrier gas may be used to introduce the crystal growing compounds into the crystal growing chamber. Many different types of crystals may be grown in the crystal growing chamber such as silicon carbide gallium arsenide, gallium phosphide, etc. The grown crystals are formed by crystal components being deposited in crystal growing sites. For example, SiC crystals are grown by introducing a silicon compound and a carbon compound into the crystal growing chamber. In the crystal growing chamber, carbon atoms disassociate from the precursor of the carbon compound and silicon atoms disassociate from the precursor of the silicon compound. The SiC crystal is then grown by carbon atoms being deposited in carbon sites and silicon atoms being deposited in silicon sites. The SiC crystal is formed from stacked double layers or film layers of silicon and carbon atoms. Each film layer is formed from a layer of carbon atoms bonded to a layer of silicon atoms. Due to the double layer stacking of SiC film layers, the SiC crystal has a silicon face and a carbon face. The crystal growing sites, such as carbon sites and silicon sites for a SiC crystal, are highly specific as to what types of atoms or molecules may enter the site during crystal growth. The high specificity of the crystal growing site is due in part to the physical configuration of the site. Each atom and molecule has a distinct size and atomic configuration. Unless an atom or molecule has the same or a similar size and configuration as the crystal growing site, the atom or molecule will have a low probability of bonding at the growing site. The crystal growing site specificity is also affected by bonding forces in and about the growing site. Each atom and molecule has an electron shell, having some charge, which interacts with electron shells of atom or molecules present about the growing site, thereby being either attracted to or repelled from the growth site. The purity of any crystal grown by the CVD process can be controlled by controlling the impurity deposition in the growth sites during crystal growth. During crystal growth, a specific growth site has a particular demand for a compatible atom or molecule. The growth site demand can be manipulated by controlling the amount of compatible atoms or molecules near the growth site. The competition for a particular growth site between a crystal atom component and an impurity atom or molecule is controlled by controlling the concentration of the respective atoms or molecules at the growth site. Surprisingly, the growth site competition can be accurately and reproducibly controlled by controlling the ratio of the crystal growing compounds introduced into the crystal growing chamber. Many crystals other than SiC crystals which have two or more growth sites potentially can be grown by a CVD process and use the site competition technique to control impurity incorporation. The recognition and implementation of growth site competition technique allows for substantially greater latitude and control as compared to prior growth techniques over crystal film growth conditions, so as to optimize crystal growth rate, surface morphology, impurity profiles and other film characteristics during crystal growth.

In accordance with a broader aspect of the present invention, there is provided a system and a method of controlling the amount of a non-crystal element deposited in a given growth area of a crystal formed from at least two crystal elements as the crystal is grown at the crystal growing area by a CVD process conducted in a growth chamber. The crystal comprises a first crystal element and a second crystal element and the grown crystal has at least two crystal growing sites. The first crystal element is deposited in the first crystal growing site and the second crystal element is deposited in the second crystal growing site. The non-crystal element is competitive for at least one of the growth sites. The improved method comprises flowing a controlled amount of gaseous crystal element compounds through the growth chamber, wherein each of the crystal element compounds include at least one of the crystal elements, and controlling the ratio of the controlled amount of gaseous crystal element compounds to control the amount of the non-crystal element deposited in a particular growth site of the crystal at the crystal growth area. The non-crystal element is an impurity such as a dopant or a contaminant. The crystal can be formed by two, three, four or more crystal elements to form a binary, tertiary, etc., type of crystal. Each crystal element is deposited in a particular crystal growth site. The non-crystal element competes with at least one particular crystal growth site. The non-crystal element normally only competes with one crystal growth site due to the geometry and charge of the non-crystal element and the geometry and charge of the crystal growing sites. If a non-crystal element can deposit itself in more than one crystal growing site, the non-crystal element usually has a much larger affinity for one over the others. The type of crystals that possibly can be grown include ZnSe, GaAs, InP, $In_xGa_{1-x}As$, GaAsP, GaP, InAs, $In_xGa_{1-x}As_yP_{1-y}$, etc.

In accordance with another aspect of the present invention, a dopant material is introduced into the crystal growing chamber and the rate of dopant incorporation into the crystal during crystal growth is controlled. Various types of dopant materials may be used to form n-type or p-type layers in the crystal. The dopant profile of a crystal is very important for the type of electronic device the doped crystal is incorporated therein. The dopant material is introduced into the growing chamber either in its pure form (i.e. nitrogen) or as a compound which includes the dopant material bound to a dopant precursor (i.e. trimethyl aluminum). The dopant material which is introduced into the growth chamber is selected such that the dopant material has an affinity for at least one of the growth sites of the crystal. Almost all dopants have an affinity for only one growth site due to the physical characteristics of the dopant and of the growth site. The select few dopants which may bind in multiple crystal growth sites have a higher affinity for one growth site as compared to the others. Once the dopant material is introduced into the crystal growing chamber, the dopant material primarily competes with a crystal element component for a particular growth site. The competition (i.e. demand) of the dopant material with a crystal atom component for a particular growth site is controlled by the manipulation of the availability of the growth site. The manipulation of the growth site demand is accomplished by adjusting the ratios of the crystal atom components within the crystal growing chamber. By proper manipulation of the ratios of the various crystal atom components, a particular growth site will become more or less available to the dopant material during the crystal growing period, thus affecting and controlling the growth site demand and the dopant concentration profile within a particular crystal.

In accordance with still another aspect of the present invention, the crystal is grown on a pretreated substrate to expand the growing parameters for producing high quality crystals. The substrate may or may not be made of the same material as the grown crystal film. A crystal film grown on a substrate may be grown homoepitaxially (substrate and crystal film have the same crystal elements and structure) or grown heteroepitaxially (substrate and crystal film have different crystal elements and/or structure). The substrate is pretreated to remove impurities from the substrate surface which may cause defective crystal films during the crystal growth. Abnormal crystal growth can take place at sites where there is contamination or defects or some other surface disturbance on the substrate surface. These contaminants or defects result in unwanted nucleation resulting in crystals having unwanted polytype structure, inferior surface morphology, stacking faults, APBs, low quality dopant profiles, high contaminant concentrations, etc. Contaminants and surface defects are removed from the substrate by proper cutting and polishing of the substrate surface and subsequent etching of the substrate surface. The etching is carried out so as not to alter the substrate surface in a manner that would impair crystal growth upon the substrate surface. The clean, low-defect substrate surface surprisingly expands the operation parameters for growing quality crystals. By reducing the stress to the crystal growing process previous Si/C concentration ratios within a growth chamber were limited in range and did not stray far from a narrow ratio-range which is dependent on the choice of hydrocarbon employed (Si:C::1:1 for $SiH_4/C_2H_4$, Si:C::2:3 for $SiH_4/C_3H_8$). With any given crystal growing process, there are stress components to the process such as temperature, pressure, crystal component concentrations, dopant concentrations, impurity concentrations, growth surfaces, etc., which affect the crystal film layer during growth. The elimination or reduction of stresses during crystal growth caused by a defective and/or contaminated substrate surface allows for a greater variance in stress levels from other stress components. The reduced stresses caused by a pretreated substrate enable the use of greater crystal compound ratio ranges in the growth chamber for enhanced control of impurity incorporation into the crystal.

In accordance with still another aspect of the present invention, there is provided a method for growing crystals whereby the crystals are grown on a particular surface face of a substrate to reduce the stresses to the crystal growing system. A substrate formed from two or more different atoms will have a crystal structure having at least three distinctive faces. Substrates formed of Si-C crystals have a silicon face (Si-face), a carbon face (C-face) and a carbon-silicon face (A-face). Each face of the crystal structure has different physical characteristics (e.g. polarity) which can increase or reduce the stresses to the crystal growing system, which will effect the quality of the crystals grown on the substrate face.

The primary object of the present invention is the provision of a method to grow high-quality, reproducible crystal films by chemical vapor deposition.

Another object of the present invention is the provision of a method for controlling impurity incorporation in a crystal film layer during the growth of a crystal.

Still another object of the present invention is the provision of a method to grow high-quality, low-defect reproducible crystals having a desired impurity profile.

Yet still another object of the present invention is to provide a method for growing crystals on a pretreated substrate whereby contaminants and surface defects have been removed from the surface of the substrate upon which crystals are to be grown.

Another object of the present invention is to provide a method for growing crystals on a particular face of the substrate to produce high quality crystals having low defects and a smooth surface morphology.

Yet another object of the present invention is to provide a method for degenerate doping of crystals for both p-type and n-type epilayers having a high-quality surface morphology and low defects.

Yet still another object of the present invention is to provide a method for growing crystals having very abrupt changes in dopant n-p type profiles.

Another object of the present invention is to provide a method of growing extremely abrupt dopant profile interfaces.

Yet another object of the present invention is to provide a method for growing low-defect, low-concentration doped single-crystals on various substrates.

Another object of the present invention is to provide a method for growing crystals having abrupt changes in dopant concentration profiles.

Still yet another object of the present invention is to provide a method for growing high-quality, low-defect crystals having gradient dopant profiles.

Yet another object of the present invention is to provide a method for increasing the range of concentration ratios usable to grow high-quality, low-defect crystals.

Yet still another object of the present invention is the provision of a method to grow high-quality, low-defect crystals having very high dopant concentrations.

These and other objects and advantages will become apparent to those skilled in the art upon reading the following description taken together with the accompanying drawings.

PREFERRED EMBODIMENT

Figure 1:
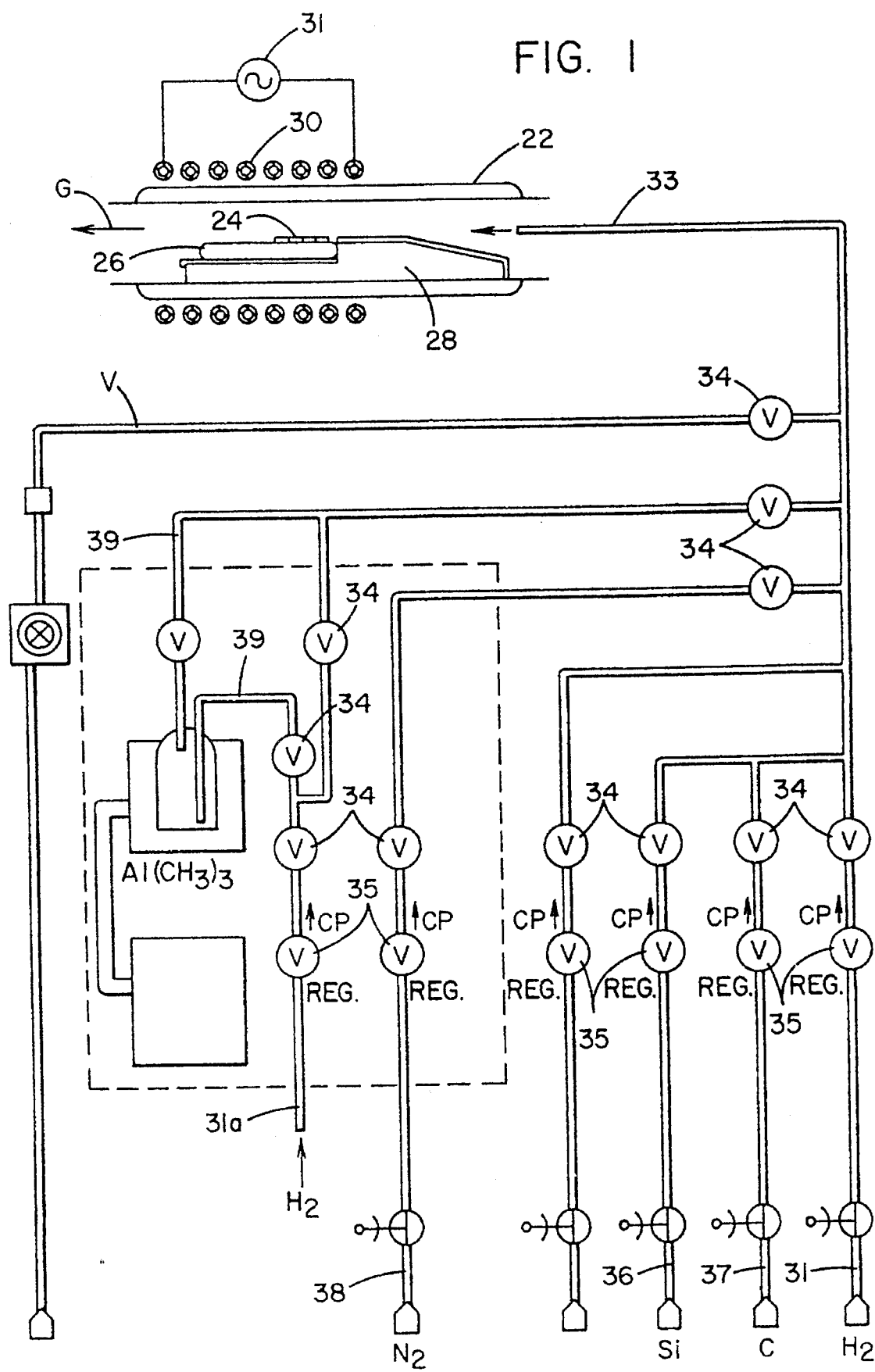
FIG. 1 is a schematic drawing of a CVD system employed for the growing and doping of crystals in accordance with the present invention.

Referring now to the drawings, wherein the showings are for the purpose of illustrating preferred embodiments of the invention only and not for the purpose of limiting the same, the invention describes an improved chemical vapor deposition (CVD) method for obtaining improved control of impurity incorporation and dopant profiles of CVD films and also improving the quality of the grown crystal films. While the method may be applied to many different crystals, the method will be specifically described with respect to the growing of silicon-carbide (SIC) crystals. The improved CVD method includes pretreating a substrate, heating the substrate in a reaction chamber, introducing a carrier gas, vaporizing the crystal growing compounds, introducing the vaporized compounds in the reaction chamber via the carrier gas, maintaining proper energy levels and material flow rates in the reaction chamber for a sufficient time to grow a crystal film having a desired smooth surface morphology, a uniform thickness, a low-defect density and a controlled impurity profile. The crystals may be intentionally doped to form n-type and/or p-type crystals. The improved CVD crystal growing method is based on the discovery that impurity incorporation into a growing SiC film layer is very sensitive to the ratio of silicon compound (Si containing precursors) and carbon compound (C containing precursors) in the reaction chamber during crystal growth. By varying the Si/C compound ratio at or near the crystal growing surface, the impurity incorporation into the growing crystal film is controlled.

The method of the invention can be carried out with a conventional chemical vapor deposition (CVD) system similar to that used in Si, SiC and GaAs semiconductor technology. The gases used in a SiC CVD system are hydrogen (used as a carrier gas), silane (used as a source of Si), HCl (used for cleaning and etching the substrate surface), propane (used as a source of C), nitrogen ($N_2$) (used as a n-type dopant), and trimethyl aluminum (TMA) (used as a p-type dopant). Other gases may be used as the Si or C source or used to dope the crystal. If organic compounds are used as the Si and C source, the process is commonly referred to as metal-organic vapor phase epitaxy (MOVPE). Any CVD system that can deliver these gases to a suitable reaction chamber at the proper flow rates under high purity conditions can be used for the inventive method.

Referring now to FIG. 1, there is shown a schematic, partial view of a suitable CVD reaction system for carrying out the process of the invention. The CVD reaction system includes a reaction chamber 22 comprised of a double-walled quartz tube such that the inner quartz tube can be water cooled. The inside diameter of reaction chamber 22 is preferably 50 mm. A SiC substrate 24 is supported by a SiC coated graphite susceptor 26, which in turn is supported by quartz support 28. To produce the desired temperature of the surface of substrate 24, a radio-frequency (RF) induction coil 30 is disposed around reaction chamber 22. Induction coil 30 is powered by frequency generator 31. The RF field produced by induction coil 30 heats substrate 24 via susceptor 26 to the desired temperature. When the SiC film layers are grown, substrate 24 is preferably a SiC substrate. The gaseous crystal compounds are introduced into reaction chamber 22 by primary line 33. Primary line 33 is located at one end of reaction chamber 22 and directs the gases to flow in direction G across substrate 24 and out the opposite end of chamber 22. The various gaseous crystal compounds are connected to primary line 33 and the gas flow is regulated by valves 34 and regulators 35 connected to each gas line. Line 36 is the silicon gas line that controls the silane flow into primary line 33, and line 37 is the carbon gas line that controls the propane flow into primary line 33. The dopants are introduced into primary line 33 by line 38 and line 39. Line 38 is the n-type dopant line and preferably controls the nitrogen gas ($N_2$) flow rate. Line 39 is the p-type dopant line and preferably controls the trimethyl aluminum (TMA) flow rate. Carrier gas line 31 carries all the gaseous crystal compounds and dopants through primary line 33 and into reaction chamber 22. The carrier gas is preferably a gas such as hydrogen gas ($H_2$). Carrier gas line 31 is partially diverted into line 31a to supply line 39 so that the carrier gas can be bubbled through the liquid TMA. A vacuum line V connected to a vacuum can be connected to primary line 33 to evacuate reaction chamber 22 of gases.

Figure 6:
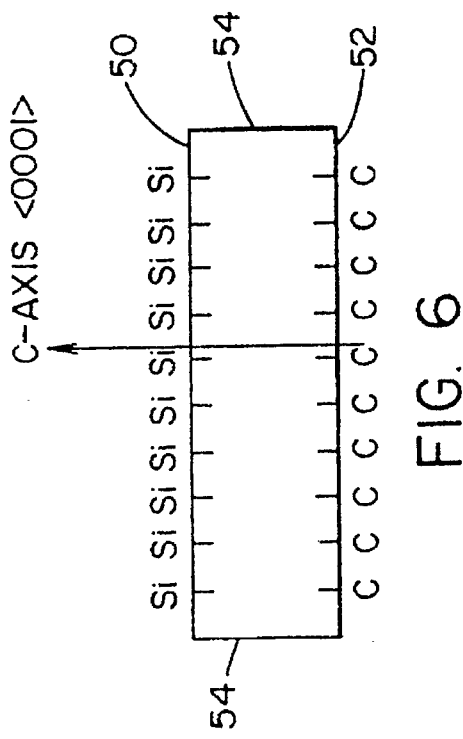
FIG. 6 is a cross-sectional view of a SiC substrate showing the Si-face and the C-face and the A-face of the substrate.
Figure 5:
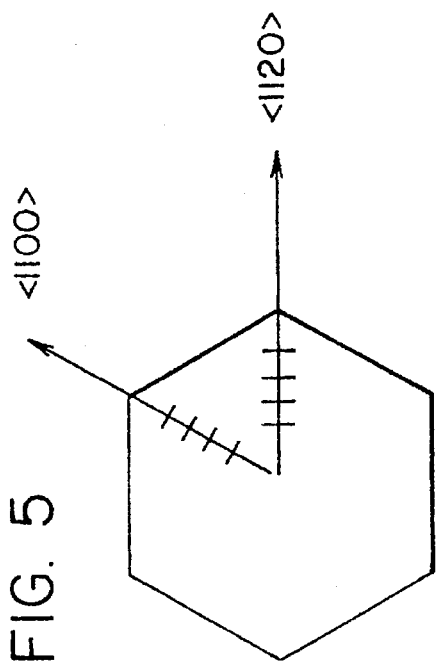
FIG. 5 illustrates a plan view of a 6H-SiC crystal showing the dimensional axis of the crystal.

Preferably, substrate 24 is pretreated to remove any contaminants or impurities on the surface of the substrate so as to facilitate the growing of high-quality, low-defect epitaxial films. SiC substrate 24 is prepared by slicing a section from a SiC boule. Substrate 24 may be cut such that the surface is slightly misoriented relative to the basal plane by some tilt angle. If 3C-SiC film layers are to be heteroepitaxially grown on an α-SiC substrate 24, the tilt angle preferably is less than 1° and additional surface preparation is necessary. If SiC film layers are to be grown homoepitaxially on SiC substrate 24, the tilt angle is preferably greater than 0.1°. The tilt direction is preferably toward the <1100> or <1120> direction, as illustrated in FIG. 5, to produce the optimum growth rates and quality of the SiC epitaxial films grown on substrate 24. The surface of substrate 24 is polished preferably on one surface with a diamond paste. SiC substrate 24 has three faces, a Si-face 50, a C-face 52 and the A-face 54, as illustrated in FIG. 6. Any of the faces may be polished and prepared for growth of the SiC epitaxial layers. Preferably, Si-face 50 is polished and used for epitaxial growth. It has been found that Si-face 50 produces the highest-quality epitaxial layer films which have the best surface morphology and lowest defects.

Figure 2:
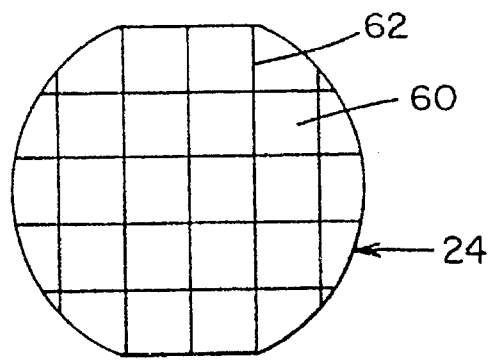
FIG. 2 is a plan view of a substrate that has been divided into selected growth regions.

If heteroepitaxy is preferred, then substrate 24 is further prepared by creating boundaries or grooves 62 on the face of substrate 24 which form growth regions 60, as illustrated in FIG. 2. Grooves 62 forming growth region boundaries 60 are preferably cut with a precision dicing saw with a 25 micrometer thin blade to minimize crystal damage; however, boundaries 60 may be formed by other processes such as photolithography, ion etching and/or photochemical or electrochemical etching processes. The width of groove 60 need only be less than 1 micrometer but larger widths can also be used. The depth of groove 60 is preferably about 50 micrometers but may be larger or smaller.

Once the substrate surface has been polished and growth regions 62 have been formed, substrate 24 is placed in reaction chamber 22. Prior to growing the crystal film layers on substrate 24, the substrate is pretreated with a pregrowth etch to remove contaminants and defects on the surface of the substrate that could act as unwanted sites for heterogeneous nucleation of the SiC film layers. These defects on the surface of the substrate can be generated during the cutting and polishing of the substrate. Preferably, the pregrowth etch involves subjecting substrate 24 to a high temperature gaseous etch in a mixture of hydrogen chloride gas and hydrogen within the reaction chamber. The etch is monitored such that the substrate is not altered in a way that unwanted sites for heterogeneous nucleation are introduced to the surface of the substrate. Preferably, the etch uniformly removes at least one atomic layer from the surface of substrate 24 to ensure a low-defect, highly-pure surface. A typical etch is carried out for about 25 minutes at a temperature of 1350° C. using about 3–4% hydrogen chloride gas in an $H_2$ carrier gas with a flow of about 3 liters per minute. Preferably, the concentration of the hydrogen chloride gas ranges between 1–5% during the pregrowth etch. Lower hydrogen chloride gas concentrations may not properly remove all the contaminants and surface defects from the substrate. Higher hydrogen chloride gas concentrations may produce a rough surface morphology or pits on the substrate, which may cause lateral growth of the epitaxial layers and create random nucleation sites throughout the surface of the substrate. The temperature during the etch ranges between 1200°–1500° C. Lower temperatures will not properly eliminate unwanted heterogeneous nucleation sites. Temperatures greater than 1500° C. will too rapidly etch the substrate surface around the peripheral edge of the substrate and introduce unwanted heterogeneous nucleation sites upon the surface of the substrate. Other pregrowth treatments, such as oxidation or reactive ion etching, may also be used to further remove potential unwanted nucleation sites prior to growing the crystal epilayers.

Figure 3:
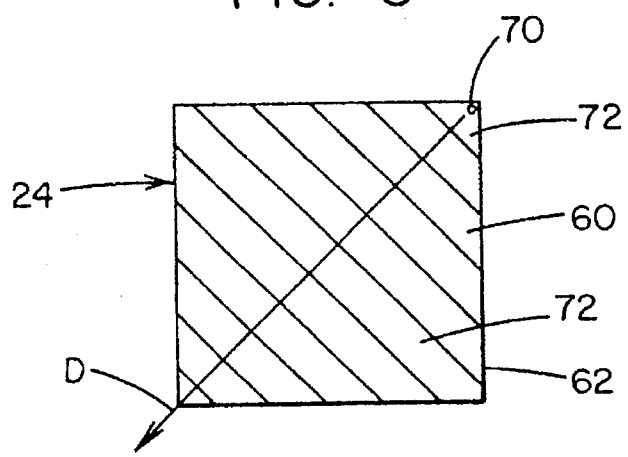
FIG. 3 is a plan view schematic drawing of a selected growth region having parallel lines which illustrates some of the atomic-scale growth steps.
Figure 4:
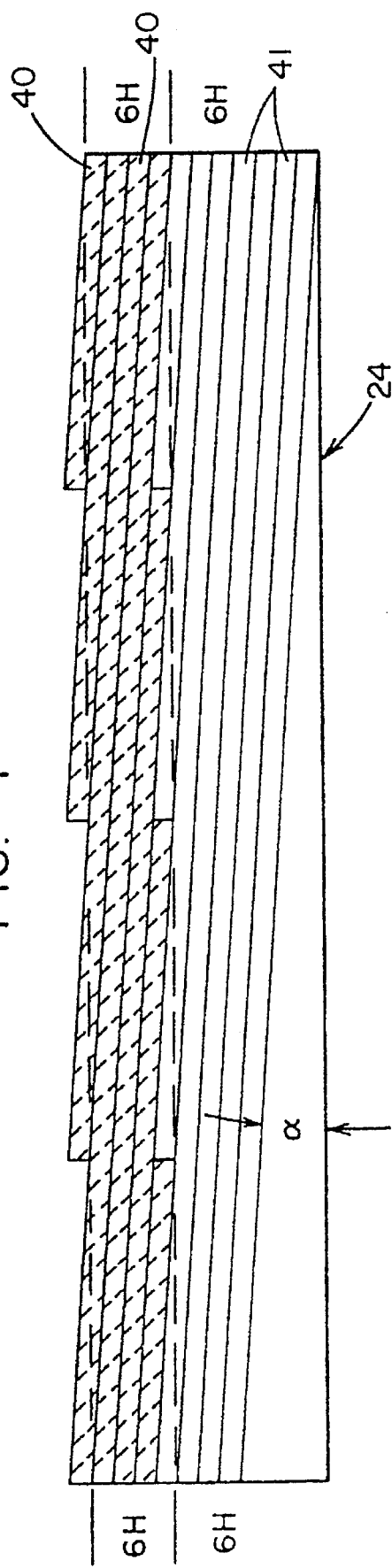
FIG. 4 is a schematic diagram illustrating the homoepitaxial growth of 6H-SiC films upon a 6H-SiC substrate.
Figure 7:
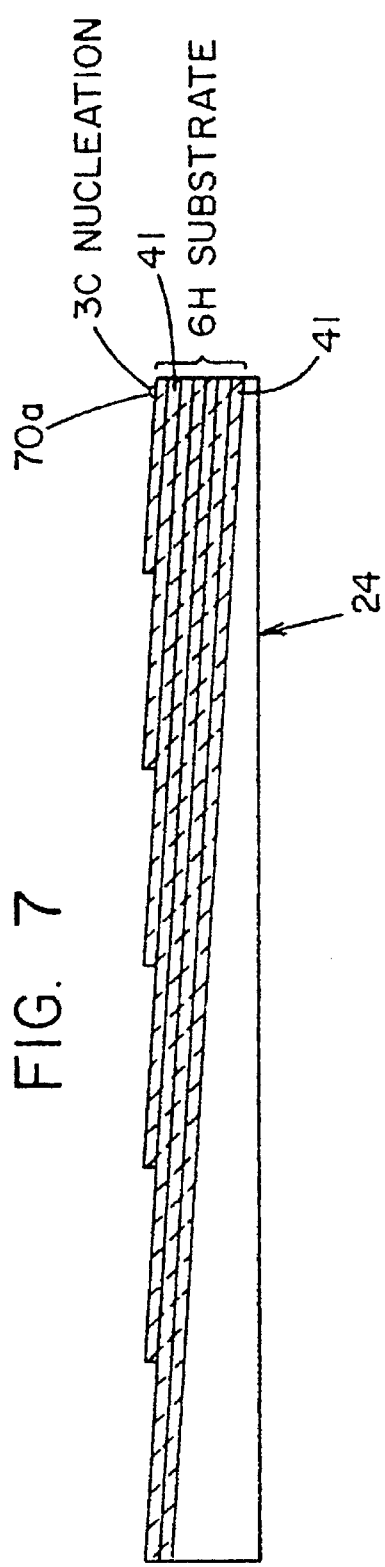
FIG. 7 is a cross-sectional view of a 6H-SiC substrate nucleated with 3C-SiC.
Figure 8:
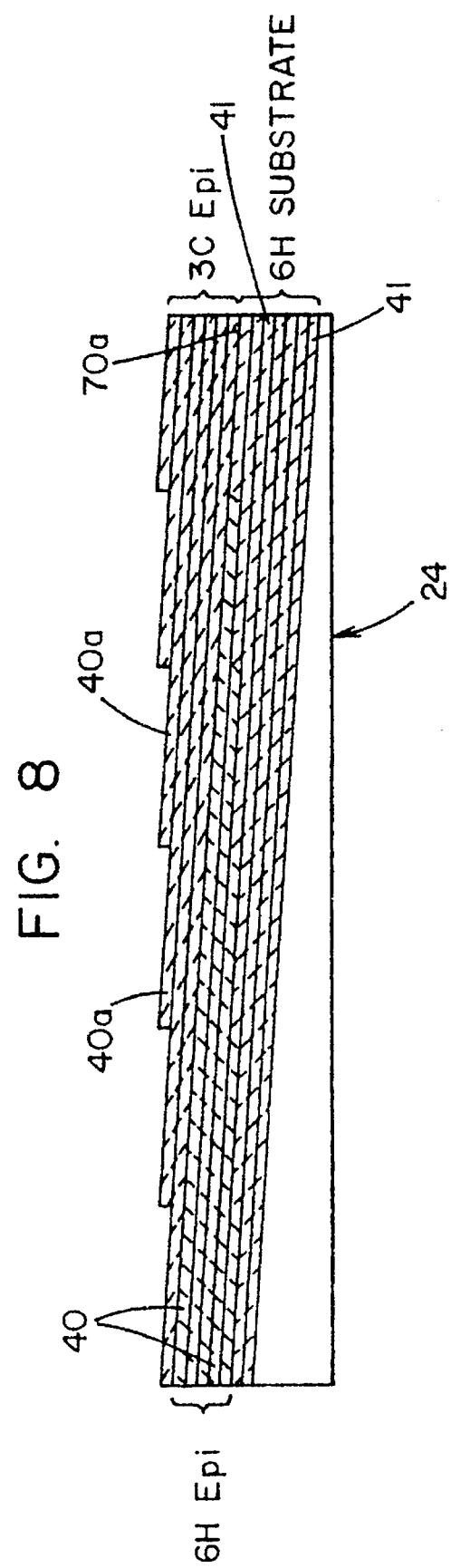
FIG. 8 is a substrate as shown in FIG. 7 illustrating the expansion of 3C-SiC growth from a nucleation point on the 6H-SiC substrate.

Referring now to FIG. 3, nucleation sites 70 on substrate 24 may be formed for intentional heterogeneous nucleation. Nucleation sites 70 can be formed by an intentional localized alteration of the surface of substrate 24. These sites 70 can be formed by indenting substrate 24 with a diamond scribe at a predetermined location, damaging substrate 24 by using an electrical probe striking an arc between the surface, and/or implanting a single-crystal whisker of some desired polytype on substrate 24. If 3C-SiC crystals are to be grown on a 6H-SiC substrate 24, as shown in FIG. 8, a whisker of 3C-SiC polytype crystal is implanted at nucleation site 70 in a desired growth region 60 of substrate 24, as illustrated in FIGS. 3 and 7. For growing SiC epilayers, the optimum location for nucleation site 70 is at the corner of growth region 60 and on the topmost terrace or step 72, as illustrated in FIG. 3. As illustrated in FIGS. 3 and 7, the surface of substrate 24 comprises several steps 72 of crystal layers. The multiple steps 72 are formed when the substrate is cut at any non-zero angle relative to the basel plane For instance, if the substrate surface is tilted at an angle α of 3° (relative to the basal plane), as illustrated in FIG. 4, a substrate surface will cut across several crystal layers to form multiple crystal layer steps 72. Nucleation site 70 should be located on the uppermost step 72, as illustrated in FIG. 3. The optimum direction of the substrate tilt is along the diagonal D of growth region 60, as illustrated in FIG. 3.

Once substrate 24 has been pretreated, reaction chamber 22 is prepared for crystal growth. Reaction chamber 22 is preferably evacuated by vacuum via vacuum line V and subsequently purged with an inert gas to remove impurities. Hydrogen gas may be used to purge the reaction chamber. Once the reaction chamber is purged, the carrier gas flow rates and the temperature within the reaction chamber are brought to equilibrium. Hydrogen gas is preferably used as the carrier gas, but other gases (e.g. inert gases) can be used. Once the temperature and flow within the reaction chamber have reached equilibrium, generally within less than one minute, silane and propane are added to the carrier gas to initiate SiC growth. Preferably, the silane concentration within the carrier gas is approximately 200 ppm resulting in a 200 ppm atomic concentration of Si. The amount of propane introduced into the carrier gas is approximately 130 ppm to 600 ppm resulting in a atomic concentration of C between 390 ppm to 1800 ppm. The prescribed pretreatment of substrate 24 allows for significantly greater deviations from the optimum Si/C ratio than was previously thought possible for growing high-quality, low-defect SiC crystals. The ratio of the atomic concentrations of Si to C may be varied to create different growth rates and different types (i.e. n or p-type) of SiC epilayers. The ratio may range between 0.01– 1.0 and preferably is between 0.1–0.5.

Referring now to FIG. 4, there is shown an atomic-scale cross-sectional drawing of 6H-SiC substrate 24 comprising several layers of 6H-SiC film 41 and several epitaxial 6H-SiC film layers 40 deposited on the surface of the substrate. SiC epilayer growth rates from a carrier gas containing 200 ppm silane and 600 ppm propane resulted in a vertical epilayer film growth rate parallel to the c-axis of about 5.5 micrometers per hour. Once the crystal begins to grow, multiple layers 40 will form on top of each other thus producing a multiple-layer SiC epitaxial film, as shown in FIG. 4.

FIGS. 7 and 8 illustrate the growth of 3C-SiC epilayers 40a on substrate 24 made of 6H-SiC epilayers 41. As the crystal growth continues over time, the 3C-SiC epilayers 40a grow laterally from 3C-SiC nucleation site 70a until the 3C-SiC epilayers (film layers) 40a completely cover the growth region. The growing of 3C-SiC boundary film layer 40a on 6H-SiC film layer 40 is called a heteroepitaxial layer. A heteroepitaxial layer is an epitaxial film layer that is of a different material, different polytype, or is lattice-mismatched from the film layer upon which it grows. The heteroepitaxial layer is under stress due to compression or tension along the plane between the two different polytype epilayers. Although there is stress between the two polytype epilayers, the 3C-SiC film layers 40a have few, if any, DPBs and stacking faults because nucleation of the 3C-SiC epilayer takes place at one location.

Figure 9:
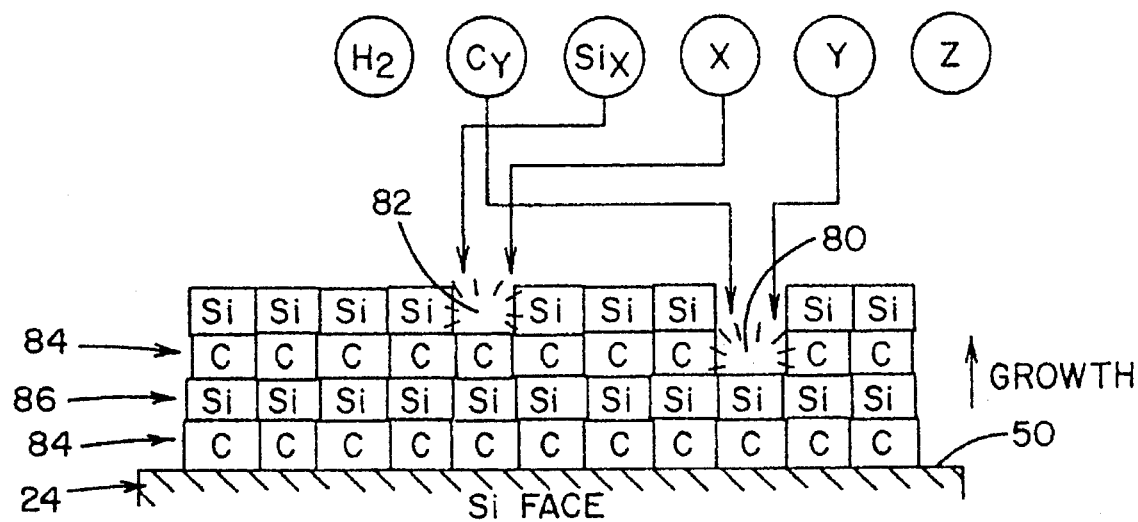
FIG. 9 illustrates the site competition at the C site and Si sites during the growing of an SiC crystal.

Referring now to FIG. 9, during the growth of the SiC epilayers Si atoms are deposited in Si sites 80 and C atoms are deposited in C sites 82. As a result, the SiC epilayers are formed by layers of Si atoms 86 and C atoms 84 forming on substrate 24. One epilayer or film layer is represented as one double-stack layer of a Si atom layer 86 and C atom layer 84. The SiC epilayers grow in stacking alternating layers of Si layers 86 and C layers 84, which increase the thickness of the SiC crystal. The type of SiC epilayer grown on the substrate can be controlled by nucleation sites and/or the polytype of the substrate. As illustrated in FIG. 4, 6H-SiC epilayers 40 are grown on a 6H-SiC polytype substrate 24, which is referred to as homoepitaxial growth. As illustrated in FIG. 8, 3C-SiC epilayers 40a are grown on a 6H-SiC polytype substrate using 3C-SiC nucleation site 70a, which is known as heteroepitaxial growth.

FIG. 9 is an atomic scale schematic illustration of Si atom layers 86 and C atom layers 84 forming on substrate 24. Si-face 50 is prepared for SiC epilayer growth resulting in C atom layer 84 being the first atom layer to form on the surface of the substrate. The growth of C atom layer 84 on Si-face 50 results in the growth of the highest-quality, lowest-defect SiC epilayers. During the growth of the SiC film layers, there are a number of different types of atoms or molecules at or near the film surface. $H_2$ represents the carrier gas in the reaction chamber. $C_Y$ and $Si_X$ represent a C atom and a Si atom respectively which have disassociated from their respective precursors and are in the process of depositing themselves in their respective C sites or Si sites. X, Y and Z represent impurities which intentionally or unintentionally exist in the reaction chamber. Specifically, X represents a dopant that competes with an $Si_X$ (Si atom) for Si site 82 and Y represents a dopant that competes with a $C_Y$ (C atom) for C site 80. Z is a contaminant that was not removed during the purging of the reaction chamber or was unintentionally introduced into the reaction chamber. Z may compete for C site 80, Si site 82, both sites or no site.

During the growth of the SiC film layer, the amount and type of impurity incorporated into the film layer is controlled to produce a SiC crystal with specifically designed properties. Dopants can be intentionally added to alter the electrical and/or optical characteristics of the SiC crystals. Phosphorous and nitrogen dopants can be added to the SiC film layers to form n-type layers and aluminum and boron can be added to SiC film layers to form p-type layers. When an n-type SiC epilayer is formed, phosphorous or nitrogen, as represented as Y in FIG. 9, competes with $C_Y$ for C sites 80 during the formation of the C atom layer 84. Similarly, p-type dopants such as aluminum and boron, as represented by X in FIG. 9, compete with $Si_X$ for Si sites 82 during the formation of the Si atom layer 86. The impurity incorporation into each atom layer is significantly affected by the ratio of Si/C in the reaction chamber. During the growing of a p-type film layer, wherein aluminum or boron is incorporated into Si atom layer 86, the amount of p-type dopant incorporated is increased by decreasing the Si/C ratio in the reaction chamber. Conversely, the amount of p-type dopant incorporated into Si atom layer 86 is decreased by increasing the Si/C ratio in the reaction chamber. Similarly, when a n-type film layer is to be grown, wherein phosphorous or nitrogen is incorporated into C atom layer 84, the amount of n-type dopant incorporation increases as the Si/C ratio increases and n-type dopant incorporation decreases as the Si/C ratio decreases.

Although the inventors do not want to be held to one theory for this physical phenomena, it is believed that the controlled incorporation of dopants into the SiC film layers is accomplished by the manipulation of site competition at C sites 80 and Si sites 82. Although dopant concentrations in the film layers can be controlled somewhat by regulating the amount of dopant introduced into the reaction chamber, very low dopant concentrations, very high degenerate dopant concentrations, sharp p-n junctions or n-p junctions, and/or reproducible dopant concentrations are unattainable by solely regulating the dopant concentration. The additional degree of control over dopant incorporation is carried out by manipulating the demand of a particular dopant at Si site 82 or C site 80 during the film layer growth. During the growth of each SiC film layer, the rate at which a layer of Si atoms 86 and C atoms 84 are formed depends on the availability of atoms and/or molecules that can fill a particle site in the Si atom 86 or C atom 84 layer. When the concentration of C atoms in the reaction chamber is increased relative to the Si atom concentration, the demand for atoms to fill C sites 80 decreases since the available amount of C atoms has increased. As a result, the C atom layer 84 is formed at a faster rate and C sites 80 are disproportionately filled with C atoms. However, the relative increase in C atoms effects a relative decrease in Si atoms available to fill Si sites 82. The relative decrease in available Si atoms results in a slower filling of Si sites 82 and a greater demand for any type of atom or molecule to fill Si site 82. The greater Si site demand results in an increase in non-Si atoms (i.e. dopants, contaminants) filling Si sites 82 to form Si atom layer 86. Conversely, a relative increase in Si atoms to C atoms in the reaction chamber decreases the demand of atoms or molecules at Si sites 82 and increases the demand of atoms or molecules at C sites 80. The decrease in Si site 82 demand, due to a relative increase in Si atom availability, results in a disproportionately high Si atom occupation in Si atom layer 86. Further, the increase in C site 80 demand reduces the rate at which the C atom layer 84 is formed and increases the amount of impurities relative to C atoms incorporated into C atom layer 84.

The simultaneous control of the multiple growth sites of the crystal can be used to control the impurity profile of crystals irrespective of the impurities contained within the reaction chamber. For instance, during the growth of SiC crystals, an n-type crystal can be grown even if equal amounts of n-type and p-type dopant were present in the reaction chamber. By properly controlling the Si/C ratio (i.e. increasing the Si/C ratio) in the reaction chamber, the simultaneous demand manipulation of Si site 82 and C site 80 is effected whereby Si site 82 demand decreases and C site 80 demand increases. The increase in C site 80 demand results in larger n-type dopant incorporation into C atom layer 84 than p-type dopant incorporation into Si atom layer 86, thereby forming an n-type SiC crystal. The simultaneous growth site manipulation may be possibly used to grow other types of crystals having at least two growth sites.

The phenomena of controlling impurity incorporation is also believed to be affected by growth site physical properties, site geometry and the growth rate of Si atom layer 86 and C atom layer 84. It is postulated that the competition for C site 80 between a C atom and an impurity is in favor of the C atom, and the competition for Si site 82 between a Si atom and an impurity is in favor of an Si atom. In a crystal lattice structure, a particular growth site has a specific geometry into which an atom or molecule can bond. For instance, in Si site 82, the geometry is of the shape of a Si atom. The electron cloud about the Si atom specifically bonds with the atoms surrounding Si site 82 to form a highly stable bond. An impurity which does not have the proper geometry to fit into Si site 82 has a very low probability of bonding. Si site 82 also has a particular charge, due to atoms located about Si site 82, which is receptive to a Si atom or another atom or molecule having a charge similar to a Si atom. Furthermore, there exists an equilibrium reaction between the bonding and unbonding of a particular atom to Si site 82. It is believed that during relatively rapid Si atom layer growth, wherein the Si/C ratio is large, the equilibrium of reaction is in favor of the Si atom. In addition, it is believed that the equilibrium of reaction in favor of the Si atom reduces as the growth rate of the Si atom layer decreases. Therefore, in a situation wherein a Si atom and an impurity simultaneously reach Si site 82, the Si atom has a higher probability to bond at Si site 82 due to its geometry, charge and equilibrium of reaction with Si site 82. The postulated competition for Si atom in Si sites 82 equally applies to C atom competition in C atom sites 80.

The control of the Si/C ratio in the reaction chamber enables the production of quality, reproducible SiC crystals which can be degenerately doped with dopant concentrations exceeding $1.0 \times 10^{19}$ cm$^{-3}$ or very light dopant concentrations at least as low as $10^{-}$cm$^{-3}$.

Figure 10:
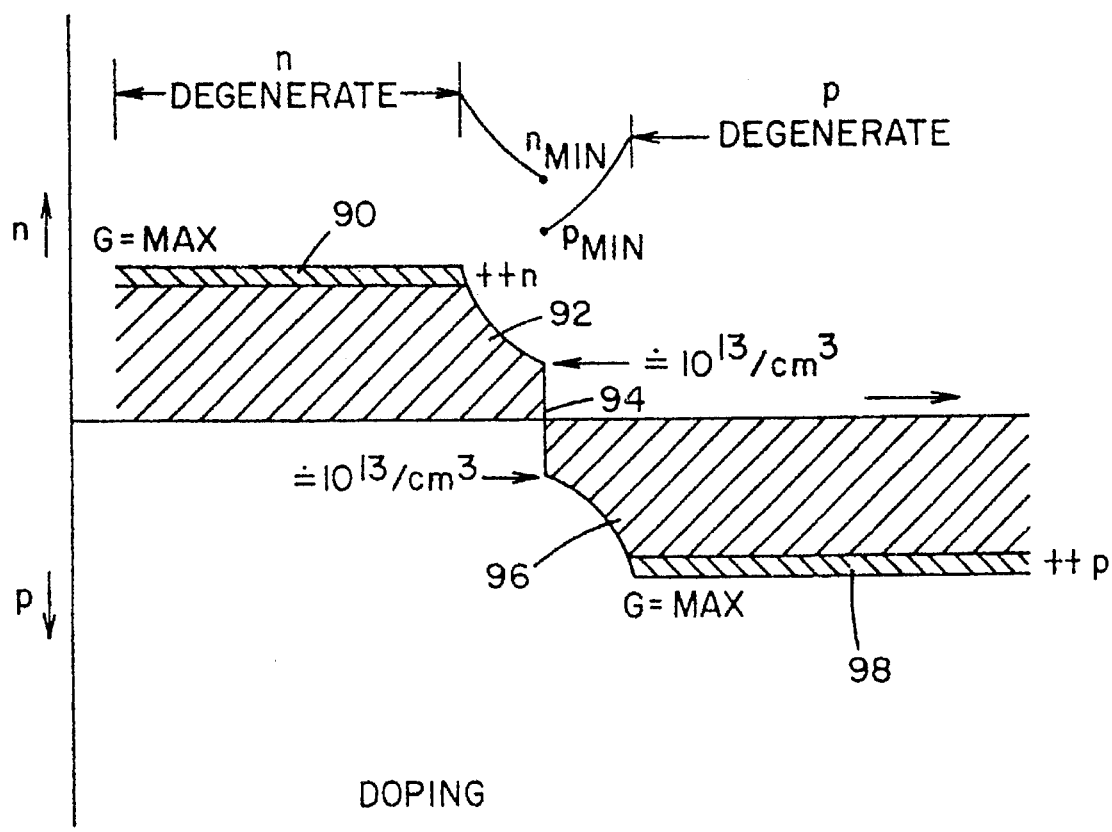
FIG. 10 is a graphic illustration of a dopant concentration profile of a crystal.

FIG. 10 illustrates a dopant profile of an n-p type SiC crystal. The SiC crystal was initially doped with an n-type dopant to produce several degenerate n-type film layers 90 containing n-type dopant concentrations exceeding $1.0 \times 10^{19}$ cm$^{-3}$. The degenerate layers generally are used as connect points between the crystal and metal connects (Ohmic contacts). The dopant profile illustrates SiC crystal film layers 92 containing decreasing amounts of n-type dopant resulting from a decrease in dopant atoms and/or a decrease in the Si/C concentration in the reaction chamber. A sharp n-p 94 junction is illustrated. Junction 94 can be produced by decreasing or terminating the n-type dopant flow into the reaction chamber and introducing or increasing p-type dopant into the reaction chamber. Further, the regulating of the Si/C concentration ratio in the reaction chamber can produce a highly defined, controllable and reproducible n-p junction. The p-type dopant incorporation is increased in film layers 96 by increasing the dopant concentration and/or decreasing the Si/C concentration ratio. The dopant incorporation is increased until p-type degenerate film layers 98 are formed. Alternatively, a p-n junction can be formed by first forming p-type film layers and then forming n-type film layers.

Figure 11:
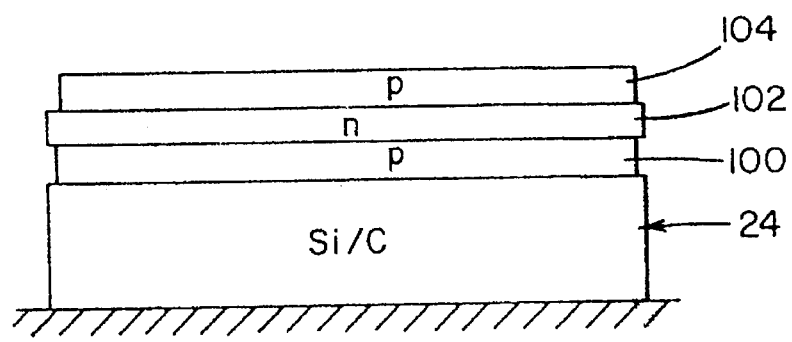
FIG. 11 is a cross-sectional view of p and n epilayers of a SiC crystal grown upon a SiC substrate.

FIG. 11 illustrates an SiC crystal having p-type SiC layer 100 growing on the surface of substrate 24, a n-type layer 102 grown on layer 100 and a p-type layer 104 grown on layer 102 to form a pnp SiC crystal which is the basic building block of all electronic devices. Many different SiC crystals with varying dopant profiles can be made by the inventive method. Controlled and reproducible dopant concentration below $1.0 \times 10^{16}$ cm$^{-3}$ and degenerate film layers exceeding $1.0 \times 10^{19}$ cm$^{-3}$ (resulting in "Ohmic as deposited" metal contacts), which were previously unattainable, can be formed by growth site manipulation through the control of Si/C concentration in the reaction chamber. The SiC film layers can be grown on a substrate surface with little or no tilt angle or with large tilt angles. The control of growth site competition by varying the Si/C concentration in the reaction chamber appears not to be affected (within reasonable limits) by the tilt angle of the surface of the substrate. However, the tilt angle has been found to affect the polytype and crystal quality of the grown SiC crystals.

The purity of a crystal grown by a CVD process can be substantially controlled by the manipulation of site competition at particular growth sites of the SiC film layers. During crystal growth, contaminants, illustrated as Z in FIG. 9, can incorporate themselves into the SiC crystal during crystal growth. Purging the reaction chamber with an ultra-purified gas, such as hydrogen, reduces some but not all the contaminants within the reaction chamber. The source of the contaminants can be the precursors for the crystal atoms, impurities which inadvertently leak and/or are introduced into the reaction chamber and/or atoms or molecules within the reaction chamber prior to crystal growth. Preferably, the crystal component precursors are selected so as not to behave as a contaminant source. A common contaminant in SiC crystal growth is aluminum. Aluminum is commonly used as a p-type dopant. Upon entering the reaction chamber, aluminum, due to its metallic properties, has a tendency to remain in the reaction chamber after the doping process has ended. During the growth of a pure SiC crystal, aluminum remaining within the reaction chamber can bond in Si sites 82 and potentially degrade the electrical characteristics of the SiC crystal. The amount of aluminum contaminant incorporation into the SiC crystal can be significantly reduced by increasing the Si/C concentration ratio in the reaction chamber and reducing the Si growth site demand. By identifying the primary contaminant which is incorporated within a SiC crystal and the growth site at which the contaminant bonds, the reduction of contaminant incorporation in the SiC crystal can be controlled by properly adjusting the crystal growing compound concentration ratio within the reaction chamber to reduce the demand of the contaminant at the growth site.

The inventive method can be applied to the fabrication of semiconductor device structures of many kinds. The technique for control over the doping is far superior to any known conventional doping technique for growing SiC crystals. The technique also provides for abrupt in situ doping during crystal growth and is capable of fully utilizing the doping concentration ranging from degenerately p-type doped (for "Ohmic as deposited" contacts) through near intrinsic (extremely low doped n-type or p-type) up to and including degenerate n-type SiC. The ability to control the dopant in such a predictable and reproducible manner is crucial in the fabrication of most SiC devices. Many modifications of the inventive method are possible; for example, the inventive method could be carried out in an ultrahigh vacuum system (e.g. a molecular beam epitaxial (MBE) system).

EXAMPLE 1

A n-type SiC crystal containing about $1.0 \times 10^{\cdot}$ cm$^{-3}$ was formed using the improved CVD method. For the method described in this example, a commercial 6H-SiC substrate cut from a 6H-SiC boule was used. The Si-face (0001) of the substrate was polished with a diamond paste and cut with a 25 mm dicing saw to form boundaries on the substrate surface. The substrate was subsequently placed within the reaction chamber and subjected to an etch for about 20 minutes at a temperature of 1375° C., using about 3%–4% HCl gas in a H$_2$ carrier gas with a flow of about 3 L/min After 25 minutes, the flow of HCl gas was terminated and the temperature of the reaction chamber was increased to 1450° C. and allowed to come to equilibrium in about 30 seconds. Silane and propane were added to the reaction chamber to begin SiC growth. Silane was added at 200 ppm (Si=200 ppm) and propane was added at 600 ppm (C=1800 ppm) to the H$_2$ carrier gas to create an Si/C ratio within the reaction chamber of 1:9. An n-type dopant, N$_2$, was added to the H$_2$ carrier gas at 40 ppm (N=80 ppm) to begin dopant incorporation into the SiC crystal. A growth rate of 5.5 micrometers/hour was achieved using the improved CVD method. After about one hour, the flow of silane, nitrogen, and propane in the H$_2$ carrier gas was terminated and the carrier gas was allowed to continue to flow in the reaction chamber for about 10 minutes during the cool down of the reaction chamber.

EXAMPLE 2

A method essentially the same as Example 1, wherein a n-type SiC crystal containing about $6.0 \times 10^{15}$ cm$^{-3}$ was grown. Silane was added at 200 ppm (Si=200 ppm) and propane was added at 350 ppm (C=1,050 ppm) to the H$_2$ carrier gas to create an Si/C ratio of 1:5.25. A n-type dopant, N$_2$, was added to the H$_2$ carrier gas at 66 ppm (N=132 ppm) to dope the SiC crystal.

EXAMPLE 3

A method essentially the same as Example 1, wherein a p-type SiC crystal containing about $3.0 \times 10^{16}$ cm$^{-3}$ was grown. Silane was added at 200 ppm (Si=200 ppm) and propane was added at 350 ppm (C=1,050 ppm) to the H$_2$ carrier gas to create an Si/C ratio of 1:5.25. A p-type dopant, trimethyl aluminum (TMA), was added to the H$_2$ carrier gas by bubbling H$_2$ into liquid TMA (held at 21° C.) such that 10 sccm (standard cubic centimeters) were introduced into the reaction chamber to dope the SiC crystal.

EXAMPLE 4

A method essentially the same as Example 1, wherein a degenerate p-type SiC crystal for Ohmic contacts containing about $2.0 \times 10^{19}$ cm$^{-3}$ was grown. Silane was added at 200 ppm (Si=200 ppm) and propane was added at 600 ppm (C=1800 ppm) to the H$_2$ carrier gas to create an Si/C ratio of 1:9. A p-type dopant, TMA, was added to the H$_2$ carrier gas at 21 sccm to dope the SiC crystal. About five minutes before cooling the reaction chamber, the silane flow was terminated and H$_2$, propane, and TMA flows were continued.

EXAMPLE 5

A method essentially the same as Example 1, wherein a degenerate n-type SiC crystal for Ohmic contacts containing about $2.0 \times 10^{19}$ cm$^{-3}$ was grown. Silane was added at 200 ppm (Si=200 ppm) and propane was added at 130 ppm (C=390 ppm) to the H$_2$ carrier gas to create an Si/C ratio of 1:1.95. An n-type dopant, N$_2$, was added to the H$_2$ carrier gas at 1153 ppm (N=2306 ppm) to dope the SiC crystal. About five minutes before cooling the reaction chamber, the propane flow was terminated and H$_2$, silane, and N$_2$ flows were continued.

EXAMPLE 6

Figure 12:
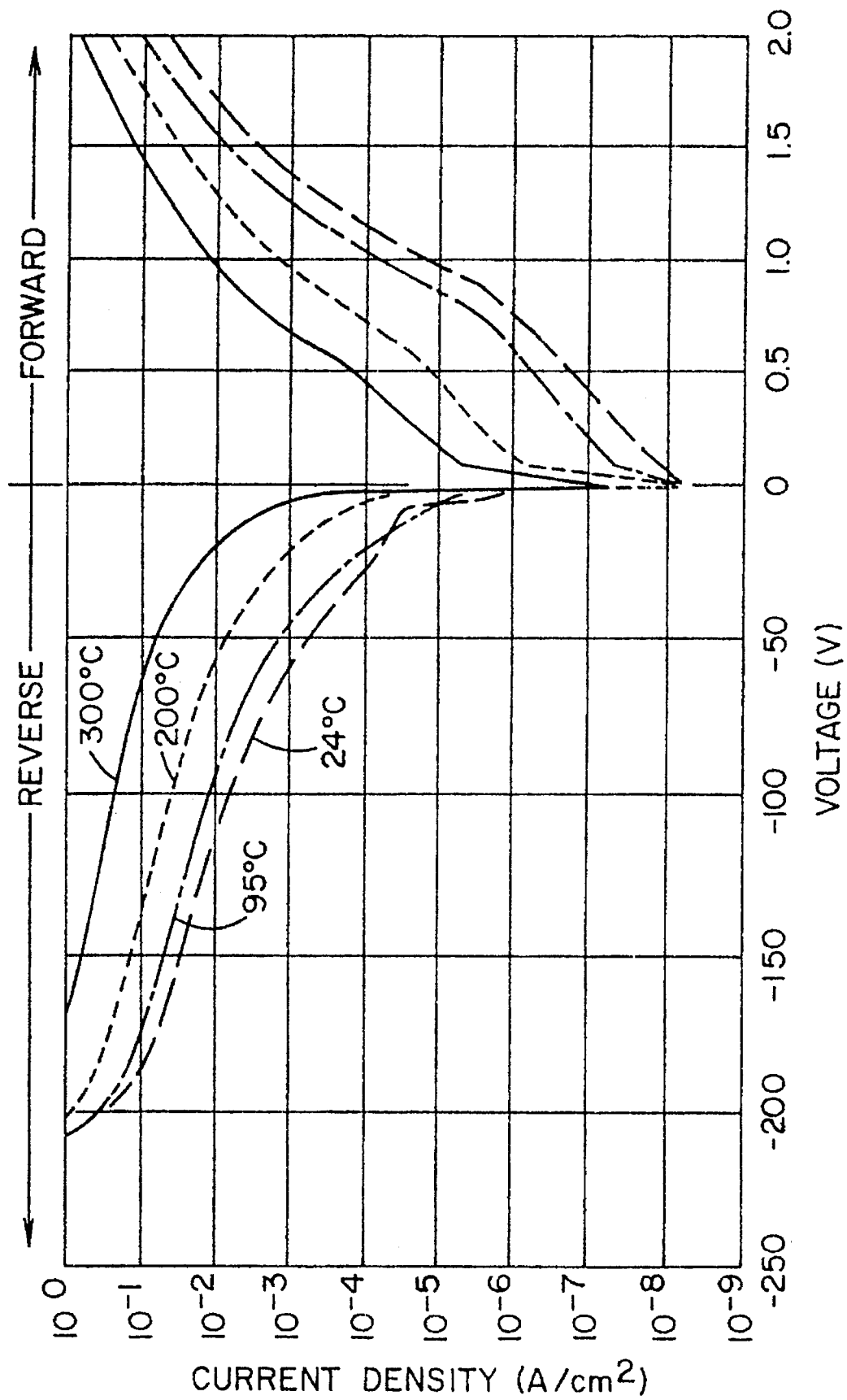
FIG. 12 illustrates the forward and reverse current-voltage characteristics on a logarithmic scale of a 3C-SiC crystal at several temperatures.

A method essentially the same as Example 1, wherein a multi-polytype SiC crystal containing a p/n junction is grown. The 6H-SiC substrate is nucleated with a 3C-SiC crystal. The tilt angle of the substrate was 0.2°–0.3°. Crystal growth is begun until the 3C-SiC crystal fans out over the complete growth region. During the initial 3C-SiC growth, degenerate n-type doping, as discussed in Example 5, is carried out. The degenerate n-type SiC epilayers are followed by the growth of low doped n-type epilayer, which are grown substantially the same as epilayers grown in Example 2. The pn junction is formed by terminating n-type epilayers and to begin growing degenerate p-type epilayers, as described in Example 4. The positional distribution of 3C-SiC epilayer mesas versus 6H-SiC epilayer mesas on the substrate was random, and the percentage of 3C-SiC mesas was roughly 50%. A 2000 Å thick aluminum etch mask defining circular and square diode mesas ranging in area from $7 \times 10^{-6}$ cm$^2$ to $4 \times 10^{-4}$ cm$^2$ was applied and patterned by liftoff. The diode mesas were etched to a depth of approximately 10 μm using reactive ion etching (RIE) in 80% SF$_6$:20% O$_2$ under 300 W rf at a chamber pressure of 250 mTorr. The aluminum etch mask was stripped by wet etch, and then a cleanup dip in boiling sulfuric acid was performed. The samples were wet oxidized for 6 hours at 1150° C. to form SiO$_2$ at least 500 Å thick. After the wafers had been patterned for contacts, vias were etched in the oxide using 6:1 buffered HF solution. Aluminum was then E-beam deposited and lifted off to complete device fabrication. The 3C diode exhibits rectification to 200 V reverse bias at ambient temperature (25° C.), which represents a 4-fold improvement in 3C-SiC diode voltage handling capability. The breakdown is repeatable (i.e., the curve can be taken numerous times with no change in device characteristics) when the current flowing during reverse breakdown is restricted to less than one milliamp; unlimited current flow results in permanent damage to the diode. On the device tested on the substrate, coronas of microplasmas were observed exclusively around device boundaries during breakdown, suggesting that reverse failures are occurring at the mesa perimeter and are not due to a bulk mechanism. Once the diode was catastrophically damaged by excessive current flow during breakdown, the multi-microplasma corona was replaced by a single microplasma which presumably was the point of catastrophic device failure along the mesa edge. FIG. 12 illustrates the forward and reverse current-voltage characteristics on a logarithmic scale at several temperatures. Although the improvement in reverse leakage naturally depends upon the voltage and temperature selected as a basis of comparison, these 3C-SiC diodes clearly represent at least an order of magnitude improvement in reverse leakage current density over any previously published 3C-SiC pn diode. Because the reverse current is not proportional to the square root of the applied voltage, it is surmised that mechanisms other than thermal generation are responsible for the reverse leakages. The exponential regions of the forward characteristics exhibit record-low saturation current densities for CVD-grown 3C pn diodes. However, the change in ideality factors with temperature is not well understood at this time.

The method described in the above examples illustrates the controlled and reproducible doping of SiC crystals having a smooth surface morphology and a low density of defects. The improved CVD method can possibly be used to grow and control purity and doping profiles of crystals other than SiC having at least two growth sites, even though such crystals involve a different chemistry, growth parameters, dopants, contaminants, etc. from that of SiC crystals. One type of crystal the improved method can possibly be used with is GaAs crystals. The following prophetic examples illustrate the controlled doping of gallium arsenic (GaAs) crystals.

EXAMPLE 7

For the method described in this example, a degenerate p-type GaAs crystal containing at least $1.0\times 10^{}cm^{-3}$ for Ohmic contacts is to be formed. A GaAs substrate is polished, growth boundaries cut and the surface etched prior to crystal growth on the substrate. The reactor chamber is brought to the proper crystal growth temperature and the carrier gas flow is to be brought to equilibrium in the chamber. Gallium and arsenic containing compounds are to be combined with the carrier gas to begin GaAs crystal growth. For the case of a p-type dopant which preferentially competes for the Ga site, the gallium concentration is to be decreased relative to the arsenic concentration, which increases the demand of Ga growth sites and, therefore, increases the incorporation of the p-type into the GaAs crystal. The amount of p-type dopant to be introduced into the reaction chamber should be the maximum amount allowed which does not adversely affect the GaAs epilayer surface morphology. Five minutes before reactor cooling, the gallium compound flowing into the reactor should be terminated and the flow of the p-type dopant, arsenic compound, and carrier gas continued.

EXAMPLE 8

A method essentially the same as prophetic example 7, wherein a degenerate n-type GaAs crystal containing at least $1.0\times 10^{19}$ cm$^{-3}$ is to be grown. For the case of an n-type dopant which preferentially competes for the As site, the gallium concentration is increased relative to the arsenic concentration to increase the As site demand to increase the incorporation of the n-type dopant into the GaAs crystal. The amount of n-type dopant to be introduced into the reaction chamber should be the maximum amount allowed which does not adversely affect the surface morphology of the GaAs crystal. Five minutes before reactor cooling, the arsenic compound flowing into the reactor should be terminated and the flow of the n-type dopant, gallium, and carrier gas continued.

EXAMPLE 9

A method essentially the same as prophetic example 7, wherein a p-type GaAs crystal containing much less than $1.0\times 10^{19}$ cm$^{-3}$ is to be grown. The gallium concentration relative to the arsenic concentration is increased to create a relatively large Ga/As ratio (relative to the Ga/As ratio of example 7) in the reaction chamber. An appropriate amount of p-type dopant is then added to the reactor.

EXAMPLE 10

A method essentially the same as prophetic example 8, wherein a n-type GaAs crystal containing much less than $1.0\times 10^{19}$cm$^{-3}$ is to be grown. The gallium concentration to arsenic concentration is to be decreased in the reactor chamber such that a relatively small Ga/As ratio (relative to the Ga/As ratio of example 8) exists. An appropriate amount of n-type dopant is then added to the reactor.

"Overview of Some Applications"

The electrical device applications of the invention center around the advantageous use of the wider doping ranges that this new growth technique makes possible. Since the invention allows for the incorporation of higher concentrations of dopant into compound semiconductor crystals than was previously possible, any electrical device structure whose performance is affected by the degree of degenerate doping achieved in any region of the device will be influenced by the present invention.

The improved CVD method significantly reduces contact resistances at the Ohmic contacts. Performance of many semiconductor device structures, such as transistors, are dependant on contact resistance. Contact resistance arises due to the physical interface where the metal (which carries electrical signals and power to and from the semiconductor device) contacts (or connects to a semiconductor surface. The performance of most semiconductor electrical devices is maximized by minimizing the contact resistances. It is a limiting factor in the electrical capability of many devices, such as transistors, which in turn limit the capabilities of electrical circuits and systems made using those devices. It is widely recognized that the resistance of contacts to 6H-SiC or 3C-SiC is the major limiting factor in the electrical capability of many 6H-SiC or 3C-SiC devices respectively. The contact resistances for semiconductor devices are minimized be maximizing the doping in the semiconductor where it makes physical contact with metal Ohmic contact. Because the improved CVD method enables device quality (i.e. high quality) epilayers of compound semiconductors (like SiC for example) to be grown with higher doping concentrations, contact resistances to these epilayers (and therefore properly designed electrical devices fabricated in these epilayers) can be reduced thereby increasing the performance capabilities of many compound semiconductor based electrical devices and circuits.

The improved CVD method also reduces bulk semiconductor resistances in the grown crystals. Another source of resistance that can affect semiconductor electrical device performance is the resistance of the bulk semiconductor itself. In almost all semiconductor devices, current flows through undepleted regions of the bulk semiconductor. The resistance associated with charge flow through these regions is often significant and can sometimes be an undesired factor which limits device performance. The resistances associated with these regions can be minimized by maximizing the doping of the semiconductor in these regions. The maximization of doping in these regions through concentration levels previously unattainable is again facilitated by this new inventive method.

The present invention can also be used to form Delta-doped semiconductor devices. These structures are based upon very thin, very heavily doped semiconductor layers. The electrical performance of Delta-doped devices are contingent upon the ability to incorporate a maximum amount of dopant into the thinnest possible layer. The ability to better control the level of degenerate doping of compound semiconductors, which is made possible by the improved CVD method, should significantly enhance the performance characteristics obtainable in Delta-doped device structures.

The improved CVD method further can be used to develop semiconductor devices with smaller depletion widths. The depletion widths found within semiconductor devices at various junctions (e.g. pn junctions, metal semiconductor junctions, hetero-junctions) are largely determined by the semiconductor doping at or around the junction. It is well known that the depletion width decreases as the doping concentration increases. There are many semiconductor devices whose performance and/or function rely on heavy doping to obtain narrow depletion widths and the associated physical effects. Zener diodes and Esaki diodes rely on carrier tunneling through a very narrow depletion region made possible by heavy doping on both sides of a pn junction. Low leakage diodes and diode junction charge storage capacitors are based on narrow depletion widths, so as to minimize generation current and maximize charge storage density. Because the improved CVD method enables heavier doping and results in smaller depletion widths, the improved CVD method has the potential to improve the performance of these devices by narrowing the device depletion widths.

The improved CVD method can also be used to develop semiconductor devices having slightly narrower bandgaps. By increasing the degenerate doping in a semiconductor, a physical phenomenon known as band tailing or bandgap narrowing takes place. The improved CVD process can be used to control the degree of degenerate doping in semiconductors used in devices in which bandgap narrowing enhances device performance, such as light-emitting diodes (LEDs) and bipolar transistors.

In addition to the controlled growth of high quality compound semiconductor epilayers with higher doping concentration, the improved CVD process also enables the controlled growth of high quality compound semiconductor epilayers with lower dopant concentrations than was previously possible. Any compound semiconductor electrical device whose performance stands to gain from the lowered doping concentrations that this improved CVD method enables will benefit. Such devices which will benefit include fundamental semiconductor junctions. Almost all semiconductor devices and circuits contain fundamental semiconductor junctions. Most transistors composed of these fundamental junctions are arranged in various configurations appropriate to accomplish the desired electrical functions (e.g. amplification, switching). Such devices will be greatly improved by the improved fundamental junction doping of the present invention. One fundamental building block of semiconductor electrical device technology is the intimate junction of p-type material to n-type material, more commonly referred to as p-n junction. It is well known to those skilled in the art that the electrical characteristics (such as junction capacitance, junction breakdown voltage, junction leakage current) of the p-n junction are governed by the physical characteristics (i.e. dopant density, defect density) of the lighter-doped side of the junction. The ability to produce a more lightly doped compound semiconductor, while obtaining the desired polarity (n-type or p-type) via this improved CVD method, dramatically broadens the range of electrical operating characteristics possible in devices that incorporate pn junctions. It is well known that the breakdown voltage of a p-n junction diode increases with reductions in the doping of the lighter doped side of the junction. Therefore, a factor of 10 or greater improvement (i.e. reduction) in doping concentrations has been demonstrated by the improved CVD method, when applied to 6H-SiC crystals, could improve 6H-SiC p-n step junction diode blocking voltages from their current demonstrated maximum of slightly more than 1,100 volts to somewhere around 10,000 volts. In a similar manner, the doping of the semiconductor also plays a major role in the electrical characteristics of another fundamental junction, the metal semiconductor junction. Similar improvements with similar ramifications can be expected for properly designed rectifying metal-SiC Schottky diode junctions. The improved CVD method can also be used in the design of transistors and circuits to permit higher circuit operating voltages.

The improved CVD method can also be used to make semiconductors with reduced junction capacitance. It is well known that diode junction capacitance decreases as doping decreases. The lighter doping, made possible by the improved CVD method, can also lead to the reduction in the depletion capacitance of compound semiconductor junctions, which will reduce the parasitic capacitances that can often limit device and circuit performance. One of these factors that limits the switching speed and high frequency performance of planar Field Effect Transistors (FET's) is the parasitic capacitance formed by the drain-to-substrate p-n diode junction. The decreased doping obtainable by this improved CVD method can decrease this junction capacitance and possibly enable compound semiconductor FET's to operate with higher frequencies and switching speeds than previously possible.

This improved CVD method can further be used to form semiconductor devices with high internal resistivity. It is known that resistivity increases as shallow ionization energy dopant concentration decreases. In many semiconductor device and integrated circuit applications, it is advantageous to build devices in high resistivity (low dopant concentration) material. Such material often provides isolation between adjacent devices on the same chip, and the degree of isolation determines the spacing between adjacent devices within a chip, which is a big concern on integrated circuits with hundreds of thousands of transistors. Since the degree of isolation is in part a function of the semiconductor purity (i.e. doping density and defect density) between the individual devices, the improved CVD method may prove useful in advantageously shrinking device spacing to allow for more devices on a single chip. Clearly, the method is useful for any device or circuit situation where higher-resistivity compound semiconductor epilayers are desired.

The improved CVD method can also be used to grow crystals used in semiconductor devices in which the crystals have increased carrier mobilities. It is known that carrier mobilities increase as doping and defect concentrations decrease. This is due to the fact that there are less potential perturbations (caused by impurities and defects) for a carrier (electron or hole) to "plow into" as it is moving through the crystal lattice under the influence of an electric field. The fact that the improved growth technique enables the growth of purer material with lower unintentional dopant incorporation should increase the carrier mobility in the compound semiconductors. It is well known to those skilled in the art that carrier mobilities directly affect the performance of many devices and circuits, and that increased carrier mobilities are attractive because they enhance the performance of most semiconductor devices, especially transistors. In most transistors, crucial electrical performance factors (switching speed, maximum operating frequency, current carrying capability, gain) are generally by increased carrier mobilities.

The improved CVD method can be used to grow crystals having increased carrier lifetimes. Carrier lifetime is another physical property of compound semiconductors that can be enhanced by growing purer crystals with lighter background defect concentrations. It is known to those skilled in the art that the bulk carrier lifetime increases as defect concentration decreases. An improvement in this property could lead to smaller recombination/generation rates within a device resulting in improved performance for certain types of devices, such as minority carrier based devices. Minority carrier based devices, such as bipolar transistors and solar cells for example, could benefit from longer lifetimes.

Possible industrial uses of SiC crystals grown using the improved CVD method include semiconductor devices and sensors for use in high temperature environments, such as advanced turbine engines, space power systems, deep-well drilling, advanced automobile engines, etc.; semiconductor devices and sensors for use in high radiation environments, such as found near nuclear reactors; semiconductor devices for power electronics applications, such as will be required for power conditioning electronics for electric vehicles, space power systems, and for electrical actuators on advanced aircraft; semiconductor devices for high frequency applications, such as found in communication satellites, high speed computers, and microwave power transistors used in radar systems, pressure transducer diaphragm material for high temperature and/or corrosive environments, and, light-emitting diodes (LEDs) for use in high temperature environments.

The invention has been described with reference to a preferred embodiment and alternates thereof. It is believed that many modifications and alterations to the embodiment as discussed herein will readily suggest themselves to those skilled in the art upon reading and understanding the detailed description of the invention. It is intended to include all such modifications and alterations insofar as they come within the scope of the present invention.

We claim:

1. A method of controlling the amount of a selected element deposited in a given growth area of a crystal formed by Si and C as a SiC crystal is being grown at said area by a CVD process conducted in a growth chamber, wherein said Si is deposited in Si growth sites and said C is deposited in C growth sites, said element being competitive for one of said growth sites, said method comprising the steps of:
   a. flowing a first amount of a gaseous Si compound through said chamber;
   b. flowing a second amount of a gaseous C compound through said chamber; and
   c. varying the ratio of said first and second amounts during the growing of said crystal to regulate said amount of said element deposited in said crystal at said area.

2. A method as in claim 1, wherein said element competes for said C growth sites.

3. A method as in claim 2, including the step of decreasing the rate of said element deposited in said C growth sites by decreasing said ratio of said first amount to said second amount.

4. A method as in claim 2, including the step of increasing the rate of said element deposited in said C growth sites by increasing said ratio of said first amount to said second amount.

5. A method as in claim 4, wherein said element is a dopant.

6. A method as in claim 5, wherein said dopant is selected from a group consisting of phosphorous, nitrogen and boron.

7. A method as in claim 1, wherein said element competes for said Si growth sites.

8. A method as in claim 7, including the step of decreasing the rate of said element deposited in said Si growth sites by increasing said ratio of said first amount to said second amount.

9. A method as in claim 7, including the step of increasing the rate of said element deposited in said Si growth sites by decreasing said ratio of said first amount to said second amount.

10. A method as in claim 9, wherein said element is a dopant.

11. A method as in claim 10, wherein said dopant is selected from a group consisting of aluminum and boron.

12. A method as in claim 1, wherein said element is a dopant.

13. A method as in claim 1, wherein said element is a contaminant.

14. A method as in claim 1, wherein said ratio of said first and second amounts is between about 0.8 to about 0.05.

15. A method as in claim 14, wherein said ratio of said first and second amounts is between about 0.5 to about 0.1.

16. A method as in claim 1, wherein said Si compound is selected from a group consisting of silicon halides or organosilicon compounds.

17. A method as in claim 16, wherein said Si compound is silane.

18. A method as in claim 1, wherein said C compound is gaseous hydrocarbon.

19. A method as in claim 1, wherein said gaseous hydrocarbon is propane.

20. A method as defined in claim 1, including the step of using a carrier gas to introduce said Si compound and said C compound into said chamber.

21. A method as in claim 1, wherein said SiC crystal is grown on at least one growth surface of a substrate.

22. A method as in claim 21, wherein said growth surface of said substrate has a non-zero inclination relative to a basal plane.

23. A method as in claim 22, wherein said growth surface is inclined toward the <1100> direction.

24. A method as in claim 22, wherein said growth surface is inclined toward the <1120> direction.

25. A method as in claim 22, wherein said non-zero inclination is less than 7°.

26. A method as in claim 21, including the step of pretreating said growth surface to remove impurities and crystal structure on said growth surface that can act as sites for heterogeneous nucleation during said crystal growth.

27. A method as in claim 26, wherein said pretreatment comprises pregrowth etching of said growth surface.

28. A method as in claim 27, wherein said pregrowth etching includes the heating said growth surface of said substrate in an HCl/H$_2$ mixture to a temperature of between 1200° C. and 1500° C.

29. A method as in claim 28, wherein the time of said etching is between 2 min. and 60 min., and the HCl concentration is between 1% and 5%.

30. A method as in claim 29, wherein said pretreating includes polishing said growth surface.

31. A method as in claim 21, wherein said substrate is a SiC substrate.

32. A method as in claim 31, wherein said growth surface is the silicon face of the SiC substrate.

33. A method as in claim 21, including the step of dividing said growth surface into growth areas by introducing at least one groove along at least one boundary of said growth areas.

34. The method as in claim 33, wherein said at least one groove is up to 50 micrometers deep.

35. A method as in claim 33, wherein said at least one groove has a width of at least 1 micrometer.

36. A method as in claim 21, including the step of nucleating at a site on said substrate to grow a particular SiC crystal polytype.

37. A method as in claim 36, wherein said nucleating of said substrate is the introduction of a suitable impurity at said site to stimulate the growth of a desired crystal structure.

38. A method as in claim 32, wherein the location of said nucleation is in a corner of said growth area.

39. A method as in claim 1, wherein said growth chamber has an inside temperature maintained at least about 1350° C.

40. A method as in claim 39, wherein said growth chamber has an inside temperature maintained between about 1350° C. to 1550° C.

41. A method of controlling the amount of a non-crystal element deposited in a given growth area of a crystal formed from at least two crystal elements as said crystal is grown at said area by a CVD process conducted in a growth chamber, said crystal elements comprising a first crystal element and a second crystal element, said crystal having at least two crystal growing sites wherein said first crystal element is deposited in a first growth site and said second crystal element is deposited in a second element growth site, said non-crystal element being competitive for at least one of said first and second growth sites, said method comprising the steps of:
   a. flowing a controlled amount of gaseous crystal element compounds through said chamber, wherein each of said element compounds include at least one of said crystal element; and,
   b. varying the ratio of said controlled amount of gaseous crystal element compounds during the growing of said crystal to regulate said amount of said non-crystal element deposited in said competitive crystal growth site at said growth area.

42. A method as in claim 41, wherein said non-crystal element only competes for said first growth site.

43. A method as in claim 42, including the step of increasing the rate of said non-crystal element deposited in said first growth site by increasing said ratio of said second crystal element compound to said first crystal element compound.

44. A method as in claim 42, including the step of decreasing the rate of said non-crystal element deposited in said first growth site by decreasing said ratio of said second crystal element compound to said first crystal element compound.

45. A method as in claim 43, wherein said non-crystal element is a dopant.

46. A method as in claim 45, including the step of pre-treating said growth surface to remove impurities and crystal structure on at least one growth surface that can act as sites for heterogeneous nucleation during said formation of said crystal.

47. A method as in claim 41, wherein said element only competes for said second growth site.

48. A method as in claim 47, including the step of increasing the rate of said non-crystal element deposited in said second element growth site by increasing said ratio of said first crystal element compound to said second crystal element compound.

49. A method as in claim 48, includes decreasing the rate of said non-crystal element deposited in said second element growth site by decreasing said ratio of said first crystal element compound to said second crystal element compound.

50. A method as in claim 48, wherein said non-crystal element is a dopant.

51. A method as in claim 50, including the step of pretreating said growth surface to remove impurities and crystal structure on said growth surface that can act as sites for heterogeneous nucleation during said formation of said crystal.

52. A method as in claim 3, wherein said element is a dopant.

53. A method as in claim 52, wherein said dopant is selected from a group consisting of phosphorous, nitrogen and boron.

54. A method as in claim 8, wherein said element is a dopant.

55. A method as in claim 54, wherein said dopant is selected from a group consisting of aluminum and boron.

56. A method of growing crystals containing a selected concentration of non-crystal element, said crystal formed from at least two crystal elements being grown by a process conducted in a growth chamber, said crystal having at least two growth sites and said non-crystal element competitive for a growth site, said method comprising:
   a) identifying said growth site said non-crystal element is competitive for;
   b) identifying the crystal element which deposits in said growth site said non-crystal element is competitive for;
   c) controlling a crystal element ratio by selecting and then maintaining the selected crystal element ratio which contains a certain amount of the competing crystal element which will compete with said non-crystal element during said crystal growth to allow a desired amount of non-crystal element to be incorporated in said growth site; and
   d) varying said controlled crystal element ratio during said crystal growth to form a crystal having multiple non-crystal element concentrations.

57. A method of growing a crystal containing a selected amount of at least one n-type dopant and a selected amount of at least one p-type dopant, said crystal formed from at least two crystal elements being grown by a process conducted in a growth chamber, said crystal having at least two growth sites and said at least one n-type dopant competitive for a n-type growth site and said at least one p-type dopant competitive for a p-type growth site, said method comprising of:

a) identifying said crystal element which deposits in said p-type growth site;

b) identifying said crystal element which deposits in said n-type growth site;

c) controlling a crystal element ratio by selecting and then maintaining the selected crystal element ratio which contains a certain amount of said n-type growth site crystal element and said p-type growth site crystal element to control the amount of n-type dopant and p-type dopant deposited in said crystal during crystal growth; and d) varying said controlled crystal element ratio during crystal growth to form a crystal having multiple n-type dopant concentrations and multiple p-type dopant concentrations.

58. A method of growing a crystal as defined in claim 57, wherein said n-type dopant concentration is maintained greater than said p-type dopant concentration in said crystal by selecting a crystal element ratio having a lower amount of n-type growth site crystal element than said p-type growth site crystal element.

59. A method as defined in claim 57, wherein said p-type dopant concentration is maintained greater than said n-type dopant concentration in said crystal by selecting a crystal element ratio having a lower amount of p-type growth site crystal element than said n-type growth site crystal element.

* * * * *